US006303514B1

(12) United States Patent
Hackett et al.

(10) Patent No.: US 6,303,514 B1
(45) Date of Patent: Oct. 16, 2001

(54) COMPOSITION AND METHOD FOR SELECTIVELY ETCHING A SILICON NITRIDE FILM

(75) Inventors: Thomas B. Hackett, Columbus; Zach Hatcher, III, Hilliard, both of OH (US)

(73) Assignee: Ashland Inc., Dublin, OH (US)

( * ) Notice: Subject to any disclaimer, the term of this patent is extended or adjusted under 35 U.S.C. 154(b) by 0 days.

(21) Appl. No.: 09/652,416

(22) Filed: Aug. 31, 2000

Related U.S. Application Data

(62) Division of application No. 09/141,897, filed on Aug. 28, 1998.

(51) Int. Cl.[7] .................................................. H01L 21/302
(52) U.S. Cl. ........................ 438/745; 438/747; 438/750; 438/756; 438/757
(58) Field of Search ..................................... 438/745, 747, 438/750, 753, 756, 757

(56) References Cited

U.S. PATENT DOCUMENTS

| | | | |
|---|---|---|---|
| 4,092,211 | * 5/1978 | Morris | 216/51 |
| 5,472,562 | * 12/1995 | Ziger | 438/757 |

* cited by examiner

*Primary Examiner*—Benjamin L. Utech
*Assistant Examiner*—Binh X. Tran
(74) *Attorney, Agent, or Firm*—Martin Connaughton

(57) ABSTRACT

The invention relates to an aqueous phosphoric acid etch bath composition with a readily soluble silicon containing composition. The baths are used in the etching step of composite semiconductor device manufacturing.

4 Claims, No Drawings

COMPOSITION AND METHOD FOR SELECTIVELY ETCHING A SILICON NITRIDE FILM

This application is a division, of application Ser. No. 09/141,897 filed Aug. 28, 1998.

BACKGROUND OF THE INVENTION

1. Field of the Invention

The present invention relates to aqueous phosphoric acid etching solutions used in the manufacture of semiconductor devices. More specifically, the invention provides an aqueous phosphoric acid etching solution that exhibits increased etch selectivity of silicon nitride films over silicon dioxide films in silicon nitride-silicon oxide composite semiconductor devices. The selective etching of silicon nitride over silicon dioxide is accomplished by use of an etch bath solution containing aqueous phosphoric acid and a silicon containing composition, such as hexafluorosilicic acid; that is readily soluble in the etch bath solution. For purposes of the invention "readily soluble" means that the silicon containing composition blends uniformly with the aqueous etch bath at room temperature. The etch bath solution does not contain hydrofluoric acid, nitric acid or mixtures thereof or compositions containing elements from Group I or II.

2. Description of Related Art

The fabrication of a composite semiconductor device consisting of a series of layers typically requires several basic processing steps. These basic processing steps include; cleaning, oxidation(atmospheric and high pressure), lithography(photolithography, electron-beam, and x-ray), doping by diffusion and implantation, deposition(electron-gun, sputter, chemical vapor deposition(CVD), low—pressure chemical vapor deposition(LPCVD), and plasma), etching(wet chemical and dry or plasma) and testing. These general techniques are well known to those skilled in the art.

The present invention provides an improved wet chemical etch method that increases the etch rate of silicon nitride and enhances the etch selectivity of a heated, aqueous phosphoric acid solution for silicon nitride relative to silicon dioxide in silicon nitride-silicon oxide composite semiconductor devices. This is accomplished by adding a readily soluble silicon containing composition, such as hexafuorosilicic acid to an aqueous, phosphoric acid containing etching bath solution. Unlike other wet etch methods using heated a phosphoric acid etch bath the silicon containing compositions of the present invention are readily soluble in the phosphoric acid containing etching bath solution. Furthermore, the solutions of the present invention do not contain hydrofluoric acid, nitric acid or mixtures thereof or compositions containing elements from Group I or II such as sodium metasilicate. The presence of sodium, magnesium and other Group I or II elements is undesirable in many semiconductor processing applications.

Phosphoric acid etching baths are known in the art. U.S. Pat. No. 4,092,211 to Northern Telecom Ltd. discloses a process for etching silicon nitride through apertures in a silicon dioxide mask in a boiling phosphoric acid bath. The process reduces the rate at which silicon dioxide is etched relative to the silicon nitride by adding a soluble silicate such as sodium metasilicate to the phosphoric acid or by adding a finely divided silica to the etching solution. According to the patent the addition of the soluble silicate or silica retards the etch rate of the silicon dioxide without affecting the etch rate of the silicon nitride. Japanese patent 60137024 to Matsushita Electric discloses the removal of a film formed from the by-products of etching a silicon nitride ($Si_3N_4$) film that has previously been subjected to a heat treatment in the presence of moisture. The by-product residues, described in the patent by the formula $Si_xN_yO_z$ are removed by etching with a phosphoric acid solution containing fluorine ions. The object of the patent is to remove layers of silicon oxide, silicon nitride, and the by-product film of the silicon nitride heat treatment in an efficient manner. Japanese patent application JP 6349808 A to Hitachi Ltd., discloses a process of suppressing the etch rate of silicon dioxide film during silicon nitride film removal. This is accomplished according to the invention by using a phosphoric acid etching solution containing silicon. Ideally, the etching solution contains at least 50 ppm silicon. The level of the silicon in the etching bath is maintained by adding fresh etching solution from a make-up vessel. U.S. Pat. No. 5,310,457 to AT&T Bell Laboratories discloses a method of achieving high etch selectivity of both silicon nitride and silicon with respect to silicon dioxide by using an etch bath of phosphoric acid, hydrofluoric acid and nitric acid. According to the patent the addition of hydrofluoric acid and nitric acid in concentrations of less than 500 ppm, ". . . increases the polysilicon and silicon nitride etch rates by as much as several orders of magnitude and 100 percent respectively." The effectiveness of the etching bath is maintained by subsequent additions of hydrofluoric acid and nitric acid. U.S. Pat. No. 5,472,562 to AT&T Corporation discloses the addition of a silicon to an etch bath, comprising; phosphoric acid, hydrofluoric acid and nitric acid. The addition of the silicon to the etch bath is said to enhance the initial etch selectivity of silicon nitride or silicon with respect to silicon oxide. The silicon added to the etch bath is soluble in the bath. An example of a composition that is soluble is hexafluorosilicic acid.

None of the references disclose or suggest a phosphoric acid containing aqueous etch bath further containing composition containing silicon, such as hexafluorosilicic acid that is readily soluble in the aqueous, phosphoric etch bath and the selective etching capabilities of this bath. The use of silicates such as those disclosed in U.S. Pat. No. 4,092,211 are not contemplated as part of the present invention.

BRIEF SUMMARY OF THE INVENTION

It has been found that the etch rate and selectivity of the silicon nitride etch relative to silicon oxide could be enhanced by adding a readily soluble silicon containing composition to an aqueous, phosphoric acid containing etch bath where no hydrofluoric acid, nitric acid or mixtures thereof or compositions containing Group I or II elements are added to the etch bath. It is a purpose of the present invention to provide a composition that overcomes the disadvantages found in the art. The compositions of the present invention exhibit an increased etch rate for silicon nitride and selectivity of etch of silicon nitride relative to silicon dioxide. The compositions of the invention are easy to prepare because the components are readily soluble in one another. A further purpose of the invention is to provide a method for effectively increasing the etch rate of silicon nitride relative to silicon dioxide in a wet chemical etching process.

BRIEF DESCRIPTION OF THE DRAWINGS

DETAILED DESCRIPTION OF THE INVENTION

Silicon nitride is widely used in the semiconductor industry as a barrier or top layer to prevent diffusion of contaminates into the semiconductor device. It is also used as a selective oxidation barrier in the Localized Oxidation of Silicon (LOCOS) process to allow oxidation to occur in required areas to provide transistor isolation. Silicon nitride is essentially inert, dense and difficult to etch. Hydrofluoric acid and buffered oxide etchants can be used but etch rates are generally slow even at high temperatures and a photoresist is often adversely effected by extreme etching conditions. Another problem is that when phosphoric acid is used in the etching solution the phosphoric acid etches both the silicon dioxide and the silicon nitride. This co-etching is undesirable when the selective etching of silicon nitride is required. The previously mentioned U.S. Pat. No. 5,472,562 teaches that the addition of a soluble silicon compound to an etching solution of phosphoric acid, hydrofluoric acid and nitric acid will aid in the selectivity of silicon nitride etching with respect to silicon and silicon dioxide. However, the presence of the additional hydrofluoric acid and nitric acid is undesirable and in many cases detrimental to the semiconductor process. Other processes disclosed in the art provide stripping compositions which have silicon added to modify the etching characteristics of the composition. Typically, this may be accomplished by adding a solid silicon containing material such as a silicon wafer to a heated phosphoric acid solution. This process is undesirable because of the length of time required to digest the silicon wafer and the presence of undissolved particles in the etching solution.

The present invention provides a method of enhancing the etch rate of silicon nitride relative to silicon dioxide in a composite semiconductor device by etching the composite semiconductor device in a heated, aqueous solution containing phosphoric acid and a silicon containing composition that is readily soluble in the aqueous etching solution. The invention further provides an aqueous etching composition containing phosphoric acid and a silicon containing composition that is readily soluble in the aqueous etching composition.

According to the invention silicon nitride can be selectively etched relative to silicon dioxide by carrying out the etching operation in a heated etching bath containing an aqueous, phosphoric acid solution and a silicon containing composition that is readily soluble in the etch bath. Commercial grade phosphoric acid can be used. Typically, the commercially available phosphoric acid is available as 80% to 85% aqueous solutions. In a preferred embodiment electronic grade phosphoric acid solutions having a particle count below 100 particles/ml and where the size of the particles is less than or equal to 0.5 microns and metallic ions are present in the acid in the low parts per million to parts per billion level per liter are used. Examples of these types of electronic grade phosphoric acids include Clean-Room® electronic grade chemicals, CleanRoom LP™, CleanRoom MB™, and CleanRoom GIGABIT® (GB) available from Ashland Chemical. No other acids such as hydrofluoric acid, nitric acid or mixtures thereof are added to the solution of the etching bath.

According to the invention a silicon containing composition is added to the etching solution. This silicon containing composition is readily soluble in the aqueous etching composition at room temperature. In a preferred embodiment the readily soluble silicon containing composition is hexafluorosilicic acid ($H_2SiF_6$). In a preferred embodiment the readily soluble silicon containing composition is present in the etch bath solution in amounts of from about 16 ppm to about 500 ppm. The concentration of the readily soluble silicon containing composition is given in weight(parts per million silicon calculated from the silicon present in the readily soluble composition based on the total bath solution). In a more preferred embodiment the readily soluble silicon containing composition is present in the etch bath solution in amounts of from about 16 ppm to about 200 ppm. In a most preferred embodiment the readily soluble silicon containing composition is present in amounts of from about 100 ppm to about 200 ppm. Silicon containing compositions further containing Group I or II elements in amounts other than as contaminants are not present in the etch bath solution of the invention. An example of such an undesirable composition would be sodium metasilicate.

The bath temperatures at which the etching is performed may be any temperature at which etching of silicon nitride-silicon oxide is carried out. This type of etching process is typically carried out at about 180° C. An advantage of the present invention is that the etching can be carried out at much lower temperatures. When an aqueous phosphoric acid etch bath according to the invention is used, etching may be effectively performed at temperatures as low as 150° C. According to the invention, the bath temperatures at which etching is performed is preferably from about 150° C. to about 180° C. The temperature of the etch bath solution is more preferably from about 150° C. to about 160° C.

Having thus described the invention, the following examples are set forth to further illustrate the invention.

Measuring Techniques etch rates were determined by measuring nitride and oxide thickness using ellipsometry(Plasmos Ellipsometer).
uniformity was calculated as
1—(Max-Min/2 ×Average)×100 with Max=maximum thickness, Min=minimum thickness, Average= average thickness measured on 49 different positions on a wafer.

Wafer Preparation wafers for determination of etch rates;
$Si_3N_4$-wafers: 200 nm LPCVD nitride on oxide barrier 100 nm thermal oxide

EXPERIMENTAL PROCEDURE

All experiments were performed in a class 1000 clean room environment in a quartz beaker, heated by a hot plate. In each set of experiments different temperatures were used (150° C., 160° C., 170° C., and 180° C.) using the same bath heated progressively. During heating of the phosphoric acid the lid was not put on the vessel. When the bath reached the desired temperature the first etch rate of $Si_3N_4$ was determined by dipping nitride wafers in the bath for 10 minutes. The etch rate of oxide was determined by a second dip of thirty minutes. The phosphoric acid used in run 1 was a GB grade 85% aqueous solution available from Riedel-de-Haen. The phosphoric acid used in runs 2 through 8 was a GB grade 85% aqueous solution from Ashland Chemical. The phosphoric acid used in runs 9 through 12 was a MB grade electronic grade 85% aqueous solution from Ashland Chemical. The hexafluorosilicic acid was a 25% aqueous solution. Run 11 containing silicon added in the form of $SiO_2$ was prepared by adding 3 grams of $SiO_2$ to 100 ml of $H_3PO_4$ and adding that combination to an 8 liter phosphoric acid etch bath and allowing it to stand overnight. The $SiO_2$ acid did not completely dissolve on heating to 150° C. after standing over night. Table I shows the results of 12 runs made at varying temperatures. The recorded results include the etch rate and uniformity of etch for both $Si_3N_4$ and $SiO_2$ and the selectivity of etch.

TABLE I

Etch rate on nitride and oxide substrate and nitride-to-oxide selectivity.

| RUN | Additive | T (° C.) | Nitride Etch rate (nm/min) | Nitride Uniformity (%) | Oxide Etch rate (nm/min) | Oxide Uniformity (%) | Selectivity |
|---|---|---|---|---|---|---|---|
| 1 |  | 150 | 3.3 ± 0.14 | 97.5 | 0.13 ± 0 | 95.8 | 25.38 |
|   |  | 160 | 5.65 ± 0.07 | 97 | 0.22 ± 0.02 | 95 | 25.68 |
|   |  | 180 | 10.3 ± 0.07 | 94.4 | 1.07 ± 0 | 92 | 9.63 |
| 2 |  | 150 | 3.26 | 97.9 | 0.02 | 98.6 | 24.2 |
|   |  | 160 | 5.74 | 97.9 | 0.23 | 98.2 | 25.2 |
|   |  | 170 | 5.12 | 97.2 | 0.49 | 97.8 | 10.5 |
|   |  | 180 | 13.7 | 90 | 0.87 | 97.5 | 15.7 |
| 3 |  | 150 | 3.5 | 96.5 | 0.15 | 97.5 | 23.3 |
|   |  | 160 | 6.6 | 96.7 | 0.18 | 97.3 | 36.7 |
|   |  | 170 | 6.4 | 96.4 | 0.23 | 97.2 | 27.8 |
|   |  | 180 | 9.9 | 94.6 | 0.6 | 96.6 | 16.5 |
| 4 | 16 ppm $H_2SiF_6$ | 150 | 5.65 ± 0.07 | 96.5 | 0.17 ± 0 | 95.5 | 33.24 |
|   |  | 160 | 7.55 ± 0.07 | 95.7 | 0.25 ± 0.02 | 95.3 | 30.2 |
|   |  | 180 | 10.6 ± 0.2 | 93.3 | 0.72 ± 0.02 | 93 | 14.65 |
| 5 | 50 ppm $H_2SiF_6$ | 150 | 7.34 | 96.1 | 0.09 | 98.3 | 81.5 |
|   |  | 160 | 9.09 | 93.9 | 0.25 | 97.4 | 36.4 |
|   |  | 170 | 10.2 | 95 | 0.47 | 96.7 | 21.7 |
|   |  | 180 | 10.7 | 94.1 | 0.88 | 97.8 | 12.1 |
| 6 | 100 ppm $H_2SiF_6$ | 150 | 10.5 | 91.9 | 0.02 | 97.2 | 462.3 |
|   |  | 160 | 12.5 | 89 | 0.17 | 97.8 | 73.56 |
|   |  | 170 | 13.4 | 87 | 0.72 | 96.7 | 18.63 |
|   |  | 180 | 15.25 | 86 | 1.33 | 95.4 | 11.46 |
| 7 | 100 ppm $H_2SiF_6$ | 150 | 8.6 | 91.2 | −0.01 | 97.6 | ∞ |
|   |  | 160 | 10.0 | 94.0 | 0.19 | 97.5 | 52.6 |
|   |  | 170 | 11.7 | 94.4 | 0.46 | 97.6 | 25.4 |
|   |  | 180 | 13.7 | 81.9 | 0.82 | 96.9 | 16.7 |
| 8 | 150 ppm $H_2SiF_6$ | 150 | 8.1 | 67.1 | −0.08 | 96.7 | ∞ |
|   |  | 160 | 13.2 | 89.6 | 0.07 | 96.5 | 188 |
|   |  | 170 | 14.9 | 90.6 | 0.69 | 96.1 | 25.1 |
|   |  | 180 | 18.2 | 32.8 | 1.24 | 93.3 | 15 |
| 9 | 200 ppm $H_2SiF_6$ | 150 | 15.0 | 36.4 | −0.34 | 97.8 | ∞ |
|   |  | 160 | 9.3 | 83.1 | 0.01 | 96.3 | 930 |
|   |  | 170 | 15.4 | 92.3 | 0.43 | 97.1 | 35.8 |
|   |  | 180 | 14.0 | 80.8 | 0.96 | 95.2 | 14.6 |
| 10 | 500 ppm $H_2SiF_6$ | 150 | (1) | (1) | −0.3 | 97.7 | ∞ |
|   |  | 160 | 14.4 | 92.5 | 0.26 | 97.9 | 55 |
|   |  | 170 | 14.0 | 97 | 1.02 | 96.4 | 14 |
|   |  | 180 | 14.5 | 95.3 | 2.28 | 87.1 | 6.4 |
| 11 | 100 ppm $SiO_2$ | 160 | 5.2 | 98.0 | 0.00 | 98.7 | ∞ |
|   |  | 170 | 7.24 | 96.6 | 0.06 | 98.5 | 121 |
|   |  | 180 | 14.8 | 87.9 | 0.29 | 98.7 | 51 |
| 12 | eq. ppm HF as in 100 ppm $H_2SiF_6$ | 150 | 13 | 86 | 2.4 | 82 | 5.45 |
|   |  | 160 | 14 | 54 | 1.89 | 89 | 7.77 |
|   |  | 170 | 14 | 82 | 2.1 | 88 | 6.92 |
|   |  | 180 | 19 | 20 | 2.24 | 89 | 8.74 |

The addition of $H_2SiF_6$ results in an increase in the etch rate of $Si_3N_4$ overall. The nitride-to-oxide selectivity decreased as the temperature increased for both the phosphoric acid with no additive and the baths containing hexafluorosilicic acid. The addition of HF to the phosphoric acid in run 12 shows an increase of both oxide and nitride etch rate and a decrease in nitride-to-oxide etch selectivity. The silicon added as $SiO_2$ in run 11 had no appreciable effect on the etch rate of the nitride film. The etch rate of run 11 is comparable to the etch rate with only phosphoric acid present in the bath.

What is claimed is:

1. A method of etching a semiconductor device where the etch rate selectivity of silicon nitride relative to silicon dioxide is enhanced, comprising:
   etching the semiconductor device in a heated, aqueous, etching solution, consisting essentially of:
   A. phosphoric acid and
   B. hexafluorosilicic acid.

2. The method as claimed in claim 1, where the etching is carried out at a temperature of from about 150° C. to about 180° C.

3. The method as claimed in claim 1, where the hexafluorosilicic acid is present in an amount of from about 16 ppm to about 500 ppm.

4. The method as claimed in claim 1, where the hexafluorosilicic acid is present in an amount of from about 100 ppm to about 200 ppm.

* * * * *